United States Patent
Zeng et al.

(10) Patent No.: US 12,126,331 B2
(45) Date of Patent: Oct. 22, 2024

(54) CLOCK CIRCUIT

(71) Applicant: SHANGHAI IC R&D CENTER CO., LTD., Shanghai (CN)

(72) Inventors: Xi Zeng, Shanghai (CN); Pu Zhou, Shanghai (CN); Jianxian Wen, Shanghai (CN); Huijie Yan, Shanghai (CN); Xiameng Lian, Shanghai (CN)

(73) Assignees: SHANGHAI IC R&D CENTER CO., LTD., Shanghai (CN); SHANGHAI INTEGRATED CIRCUIT EQUIPMENT & MATERIALS INDUSTRY INNOVATION CENTER CO., LTD, Shanghai (CN)

( * ) Notice: Subject to any disclaimer, the term of this patent is extended or adjusted under 35 U.S.C. 154(b) by 0 days.

(21) Appl. No.: 17/913,145

(22) PCT Filed: Dec. 22, 2020

(86) PCT No.: PCT/CN2020/138331
§ 371 (c)(1),
(2) Date: Sep. 20, 2022

(87) PCT Pub. No.: WO2021/196762
PCT Pub. Date: Oct. 7, 2021

(65) Prior Publication Data
US 2024/0048138 A1    Feb. 8, 2024

(30) Foreign Application Priority Data

Apr. 2, 2020 (CN) .......................... 202010255345.7

(51) Int. Cl.
*H03K 17/22* (2006.01)
*H03L 7/00* (2006.01)

(52) U.S. Cl.
CPC .......... *H03K 17/22* (2013.01); *H03K 17/223* (2013.01); *H03L 7/00* (2013.01)

(58) Field of Classification Search
CPC ................ H03K 17/22; H03K 17/223; H03K 2017/226; H03L 7/00
See application file for complete search history.

(56) References Cited

U.S. PATENT DOCUMENTS

2005/0190627 A1* 9/2005 Nakatake .................. H03L 7/08
                                                          365/226

* cited by examiner

*Primary Examiner* — Jung Kim
(74) *Attorney, Agent, or Firm* — Andrew C. Cheng

(57) ABSTRACT

A clock circuit comprises an oscillator circuit and a power-on reset circuit, the oscillator circuit comprises a current generating module and a loop oscillation module connected together; the current generating module is used for outputting a control current to the loop oscillation module; the loop oscillation module is used for outputting an oscillation signal with a set frequency under action of the control current; and the power-on reset circuit is connected to the loop oscillation module and is used for providing an enabling control signal to the loop oscillation module after a power supply is powered on to the power-on reset circuit and the oscillator circuit.

10 Claims, 2 Drawing Sheets

CLOCK CIRCUIT

CROSS-REFERENCE TO RELATED APPLICATION

This application claims priority of International Patent Application Serial No. PCT/CN2020/138331, filed Dec. 22, 2020, which is related to and claims priority of Chinese Patent Application Serial No. CN202010255345.7, filed Apr. 2, 2020. The entirety of each of the above-mentioned patent applications is hereby incorporated herein by reference and made a part of this specification.

TECHNICAL FIELD

The disclosure relates to the technical field of integrated circuits, in particular to a clock circuit.

BACKGROUND

With development of integrated circuits, circuit performances need to be continuously improved, wherein, for an integrated circuit system, a clock circuit is an important input signal of many analog circuits and digital circuits, thus the clock circuit is an important circuit in the integrated circuits.

In many systems, the clock circuit must respond quickly after power-up, which can shorten a power supply-up settling time of an entire system. Therefore, how to start the clock circuit quickly and stably is an important issue in the clock circuit. However, since an oscillator circuit in the clock circuit is controlled by a POR (Power-on Reset) circuit, voltages of all nodes of the entire oscillator circuit need to be turned on simultaneously and slowly set until stable. As shown in FIG. 1, the POR circuit of the clock circuit is connected to a current generating module 10 and a loop oscillation module 20 simultaneously, thus the voltages of all nodes of the entire oscillator circuit need to be set after releasing a control signal of the POR circuit, and then a clock can be stable only after the voltages of all nodes are stable. It causes a stabilization time of the oscillator circuit is a sum of a time for releasing the POR circuit and a time required for stabilizing the voltages of all of the nodes, thus an entire settling time is longer, and ultimately the entire oscillator circuit is set up slowly.

SUMMARY

The purpose of the present invention is to provide a clock circuit, to solve a problem of slow setting of an oscillator circuit.

In order to achieve the above objective, the present invention provides a clock circuit comprises an oscillator circuit and a power-on reset circuit, wherein the oscillator circuit comprises a current generating module and a loop oscillation module connected together;
  the current generating module is used for outputting a control current to the loop oscillation module;
  the loop oscillation module is used for outputting an oscillation signal with a set frequency under action of the control current; and
  the power-on reset circuit is used for providing an enabling control signal to the loop oscillation module after a power supply is powered on;
  the power-on reset circuit is connected to the loop oscillation module.

Further, the loop oscillation module comprises a first sub-module and a second sub-module, the first sub-module and the second sub-module are connected in series, and the first sub-module comprises a plurality of comparators and control logic circuits.

Further, the first sub-module comprises a first comparator, a second comparator, a first control logic circuit and a second control logic circuit;
  a first input end of the first comparator is simultaneously connected to a current mirror circuit branch and a second input end of the second comparator; a second input end of the first comparator is floating; a first input end of the first control logic circuit is connected to an output end of the first comparator; a second input end of the first control logic circuit is connected to an output end of the second control logic circuit; an output end of the first control logic circuit is simultaneously connected to a switch control module and the first input end of the second control logic circuit; a first input end of the second comparator is floating, and an output end of the second comparator is connected to a second input end of the second control logic circuit.

Further, the power-on reset circuit comprises a first output end and a second output end;
  the first output end of the power-on reset circuit is simultaneously connected to the first input end of the first control logic circuit and the output end of the first comparator; and the second output end of the power-on reset circuit is simultaneously connected to the output end of the second comparator and the second input end of the second control logic circuit.

Further, the oscillator circuit further comprises the switch control module, and the power-on reset circuit is connected to the loop oscillation module by the switch control module.

Further, the switch control module is connected between the first sub-module and the second sub-module.

Further, the switch control module comprises a first switch and a second switch;
  a first end of the first switch is simultaneously connected to the output end of the first control logic circuit and the power-on reset circuit; a second end of the first switch is simultaneously connected to a first end of the second switch and the input end of the second sub-module; a second end of the second switch is grounded and connected to the power-on reset circuit simultaneously;
  wherein, the first switch and the second switch are selectively turned on.

Further, a first end of the second sub-module is connected to the switch control module, and a second end of the second sub-module is connected to the current mirror branch circuit and used as an output end of the oscillator circuit.

Further, the second sub-module comprises a plurality of inverters.

Further, the current generating module comprises a current mirror circuit branch, a feedback loop and a capacitor, the feedback loop is used for generating a substantially constant current required in the oscillator circuit, and the current mirror branch circuit is used for generating a current required for charging and discharging of the oscillator circuit and generating a periodic oscillation signal by charging and discharging of the capacitor.

Comparing with the prior art, beneficial effects of the present invention are as following:
  the present invention is to provide a clock circuit comprises an oscillator circuit and a power-on reset circuit, the oscillator circuit comprises a current generating module and a loop oscillation module connected together; the current generating module is used for outputting a control current to the loop oscillation module; the loop oscillation module is used for outputting an oscillation signal with a set frequency under action of the control current; and the power-on reset circuit is used for providing an enabling control signal to the loop oscillation module after a power supply is powered on; the power-on reset circuit is connected to the loop oscillation module. In the present invention, the power-on reset circuit is only connected with the loop oscillation module, thus during a power-on process of the power supply, all nodes of the current generating module are gradually set with power-on of the power supply, thus a circuit setting time of the current generating module are comprised in a time for releasing an enable control signal of the power-on reset circuit, so as to accelerate a settling time of the oscillator circuit.

BRIEF DESCRIPTION OF THE DRAWINGS

in FIG. 1:
10—current generating module; 20—loop oscillation module;
In FIGS. 2 and 3:
C—capacitor; OTA—amplifier; M0—loop transistor; C1—first comparator;
C2—second comparator; NOR1—first control logic circuit; NOR2—second control logic circuit; INV—inverter; S1—first switch; S2—second switch;
100—oscillator circuit; 110—current generating module; 111—current mirror circuit branch; 112—feedback loop; 120—loop oscillation module; 121—first submodule; 122—second submodule; 200—POR circuit.

DETAILED DESCRIPTION

Figure 1:
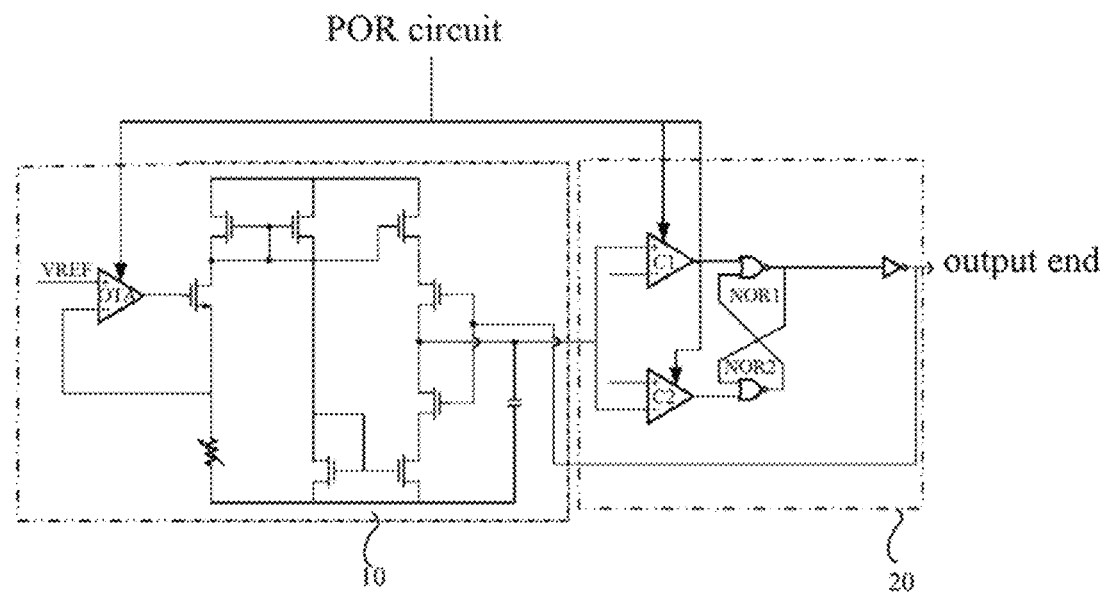
FIG. 1 is a schematic structural diagram of a clock circuit.

The core of the present invention is to provide a clock circuit comprises an oscillator circuit and a power-on reset circuit, the oscillator circuit comprises a current generating module and a loop oscillation module connected together; the current generating module is used for outputting a control current to the loop oscillation module; the loop oscillation module is used for outputting an oscillation signal with a set frequency under action of the control current; and the power-on reset circuit is used for providing an enabling control signal to the loop oscillation module after a power supply is powered on; the power-on reset circuit is connected to the loop oscillation module. In the present invention, the power-on reset circuit is only connected with the loop oscillation module, thus during a power-on process of the power supply, all nodes of the current generating module are gradually set with power-on of the power supply, thus a circuit setting time of the current generating module are comprised in a time for releasing an enable control signal of the power-on reset circuit, so as to accelerate a settling time of the oscillator circuit.

A clock circuit of the present invention will be described in further detail below. The specific embodiments of the present invention will be further described in detail below with reference to the accompanying drawings. It should be noted that, in the following specific embodiments, when describing the embodiments of the present invention in detail, in order to clearly represent the structure of the present invention and facilitate the description, the structures in the accompanying drawings are not drawn according to the general scale, and the Partial enlargement, deformation and simplification of processing are shown, therefore, it should be avoided to interpret this as a limitation of the present invention.

In the interest of clarity, not all features of an actual embodiment are described. In the following description, well-known functions or constructions are not described in detail since they would obscure the invention with unnecessary detail. It should be recognized that in the development of any actual embodiment, a great deal of implementation detail must be made to achieve the developer's specific goals, such as changing from one embodiment to another in accordance with system-related or business-related constraints. Additionally, it should be appreciated that such a development effort may be complex and time consuming, but would be merely routine for those skilled in the art.

In order to make the objects and features of the present invention more clearly understood, the specific embodiments of the present invention will be further described below with reference to the accompanying drawings. It should be noted that, the accompanying drawings are all in a very simplified form and use imprecise ratios, and are only used for facilitate and clearly assist the purpose of explaining the embodiments of the present invention.

It should be understood that, in the following description, "circuit" refers to a conductive loop formed by at least one element or sub-circuit by electrical or electromagnetic connection. When an element or circuit is referred to as being "connected" to another element or an element/circuit is "connected" between two nodes, it may be directly coupled or connected to the other element or intervening elements may be present, and the connection between the elements may be physical, logical, or a combination thereof. In contrast, when an element is referred to as being "directly coupled" or "directly connected" to another element, it is meant that there are no intervening elements present.

Embodiment 1

Figure 2:
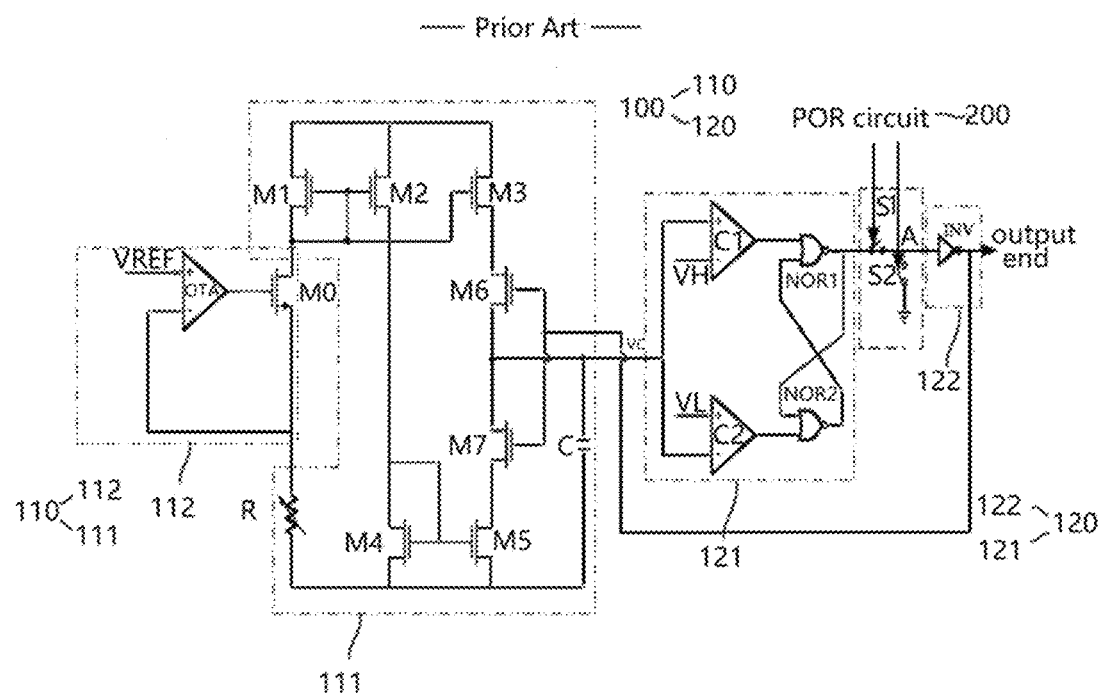
FIG. 2 is a schematic structural diagram of a clock circuit according to embodiment 1 of the present invention.

This embodiment provides a clock circuit. FIG. 2 is a schematic structural diagram of a clock circuit according to embodiment 1 of the present invention. As shown in FIG. 2, the clock circuit comprises an oscillator circuit 100 and a POR circuit 200.

The oscillating circuit is used for outputting an oscillating signal with a set frequency, and the oscillating circuit can be an RC (resistance-capacitor) oscillating circuit. The oscillator circuit 100 comprises a current generating module 110, a loop oscillation module 120 and a switch control module, the current generating module 110 is used for outputting a control current to the loop oscillation module 120, and the loop oscillation module 120 is used for outputting the oscillating signal with the set frequency under the action of the control current. The POR circuit 200 is connected to the loop oscillation module 120 by the switch control module, and is enabled to provide an enable control signal to the loop oscillation module 120, and the current generating module 110 is not affected by the POR circuit 200, thus voltages of all nodes of the current generating module 110 do not need to be set after a control signal of the POR circuit is released, that is, during a power-on process of a power supply, all of the nodes of the current generating module is gradually set with powering on the power supply, thus a circuit setting time of the current generating module is comprised in a time for releasing the enable control signal of a power-on reset circuit, so as to accelerate setting time of the oscillator circuit.

The current generating module 110 comprises a current mirror circuit branch 111, a feedback loop 112 and a capacitor C. The feedback loop 112 is used for generating a substantially constant current required in the oscillating circuit, and the current mirror branch circuit 111 is used for generating a current required for charging and discharging the oscillating circuit, and generating a periodic oscillation signal by charging and discharging of the capacitor.

The feedback loop 112 comprises an input end, a first output end and a second output end, the input end of the feedback loop 112 is used for providing a voltage Vref, and the first output end and the second output end of the feedback loop 112 are connected to the current mirror branch circuit 111. In this embodiment, the feedback loop 112 comprises an amplifier OTA and a loop transistor M0, the amplifier OTA comprises a first end, a second end and a third end, wherein the first end of the amplifier OTA is the input end of the feedback loop 112, which is used for inputting the voltage Vref, the second end of the amplifier OTA is connected to a first end of the transistor M0 and the current mirror branch circuit 111 simultaneously, and the third end of the amplifier OTA is connected to a gate of the loop transistor M0. The first end of the loop transistor M0 is the first output end of the feedback loop 112, and a second end of the loop transistor M0 is the second output end of the feedback loop 112.

The current mirror branch circuit 111 comprises a first output end, a second output end, a third output end and a fourth output end, and both of the first output end and the second output end of the current mirror branch circuit are connected to the feedback loop 112, the third output end and the fourth output end of the current mirror branch circuit are connected to the loop oscillation module 120. Specifically, the loop oscillation module 120 comprises a first end and a second end, wherein the third output end of the current mirror branch circuit is connected to the second end of the loop oscillation module 120, and the fourth output end of the current mirror branch circuit is connected to the first end of the loop oscillation module 120.

In this embodiment, the current mirror branch circuit 111 comprises a first transistor M1 to a seventh transistor M7 and a resistor R. Wherein, a first end of the first transistor M1 is a first output end of the current mirror branch circuit, and the first end of the first transistor M1 is connected to the first end of the loop transistor M0; the second end of the transistor M1 is simultaneously connected to a second end of the second transistor M2 and a second end of the third transistor M3; a gate of the first transistor M1 is simultaneously connected to the first end of the first transistor M1, a gate of the second transistor M2 and a gate of the third transistor M3; a first end of the second transistor M2 is simultaneously connected to a second end of the fourth transistor M4, a gate of the fourth transistor M4 and a gate of the fifth transistor M5; a first end of the third transistor M3 is connected to a second end of the sixth transistor M6; a first end of the fourth transistor M4 is simultaneously connected to a first end of the resistor R, a first end of the fifth transistor M5 and a first end of the capacitor C; a second end of the fifth transistor M5 is connected to a first end of the seventh transistor M7; a first end of the sixth transistor M6 is a fourth output end of the current mirror branch circuit, which is simultaneously connected to a second end of the seventh transistor M7, a second end of the capacitor and the loop Oscillation module 120; a gate of the sixth transistor M6 is used as a third output end of the current mirror branch circuit, which is simultaneously connected to a gate of the seventh transistor M7 and the loop oscillation module 120. The sixth transistor M6 is used for controlling turn-on or turn-off of the third transistor M3, and the seventh transistor M7 is used for controlling turn-on or turn-off of the fifth transistor M5.

In this embodiment, the first transistor M1 to the third transistor M3 are, for example, the same size, and the fourth transistor M4 and the fifth transistor M5 are, for example, the same size, thus currents of the first transistor M1 to the fifth transistor M5 in the current mirror branch circuit are the same. Under an action of the feedback loop 112, a voltage on the first end of the amplifier OTA is equal to the voltage on the second end thereof, so as to form a basic reference current (Iref) flowing through the resistor R, and Iref=Vref/R. Under action of the first transistor M1 to the fifth transistor M5, if a current flows through the third transistor M3 and the fifth transistor M5, currents flowing through the third transistor M3 and the fifth transistor M5 are also the same, which are Iref, and whether currents flow through the third transistor M3 and the fifth transistor M5, is respectively related to whether the sixth transistor M6 and the seventh transistor M7 are turned on. Of course, in other embodiments, sizes of the first transistor M1 to the fifth transistor M5 can be set according to requirements.

The loop oscillation module 120 comprises a first sub-module 121 and a second sub-module 122 connected in series, the switch control module is connected between the first sub-module 121 and the second sub-module 122, and a fourth output end of the current mirror branch circuit 111 is connected to the first sub-module 121, and a third output end of the current mirror branch circuit 111 is connected to the second sub-module 122. The first sub-module 121 comprises a plurality of comparators and control logic circuits. In this embodiment, the first sub-module 121 comprises comparators (a first comparator C1 and a second comparator C2) and two control logic circuits (a first control logic circuit NOR1 and a second control logic circuit NOR2), a first input end of the first comparator C1 is simultaneously connected to the fourth output end of the current mirror branch circuit and a second input end of the second comparator C2; a second input end of the first comparator C1 is floating. The first control logic circuit NOR1 and the second control logic circuit NOR2 are, for example, NAND gates, and both the first control logic circuit NOR1 and the second control logic circuit NOR2 comprise a first input end, a second input end and an output end, the output signal of the first control logic circuit NOR1 is used for controlling charging and discharging of the current generating module 110, and by controlling charging and discharging currents, a capacitance value, and input a voltage of the comparator, a period and a duty cycle of the oscillating signal of the oscillating circuit are determined.

A first input end of the first control logic circuit NOR1 is connected to an output end of the first comparator; a second input end of the first control logic circuit NOR1 is connected to an output end of the second control logic circuit; an output end of the first control logic circuit NOR1 is simultaneously connected to the switch control module and a first input end of the second control logic circuit NOR2. A first input end of the second comparator C2 is floating, and an output end of the second comparator C2 is connected to a second input end of the second control logic circuit NOR2. The loop oscillation module 120 is used for limiting a highest voltage and a lowest voltage of the basic oscillation signal generated by the oscillator circuit by the comparator, and generating a periodic oscillation signal by controlling charging and discharging of the oscillator circuit.

The second sub-module 122 comprises, for example, a plurality of inverters. In this embodiment, the second sub-module 122 comprises, for example, an inverter INV, and an input end of the inverter INV is connected to the switch control module, an output end of the inverter INV is connected to a third output end of the current mirror branch circuit. The output end of the inverter INV is used as an output end of the oscillator circuit 100.

The switch control module is used for keeping the loop oscillation module 120 and the current generating module 110 resetting before the power supply is powered on, and keeping a loop of the loop oscillation module 120 working normally after the power supply is powered on. The switch control module comprises, for example, a first switch S1 and a second switch S2, and a first end of the first switch S1 is connected to the output end of the first control logic circuit NOR1 and the POR circuit 200 simultaneously; a second end of the first switch S1 is simultaneously connected to the first end of the second switch and the input end of the inverter INV; a second end of the second switch S2 is grounded and connected to the POR circuit 200 simultaneously. Since the first switch S1 and the second switch S2 are controlled by two opposite signals from the same POR circuit 200, states of the first switch S1 and the second switch S2 are different at each moment, that is, for the first switch S1 and the second switch S2, at each moment, one of them must be turned off, and the other one must be turned on.

As shown in FIG. 2, when the first switch S1 is turned off and the second switch S2 is turned on, since a circuit of the loop oscillation module 120 is in an open-loop state, all of the nodes of the oscillator circuit maintain a reset state stably.

When the first switch S1 is turned off and the second switch S2 is turned on, a power-on process is entered first. Meanwhile, the oscillator circuit is started from a reset state, the enable control signal is not released by the POR circuit 200, the loop oscillation module 120 is in the open-loop state, and the voltages of all of the nodes of the loop oscillation module 120 remain unchanged, thus all of the nodes of the loop oscillation module 120 are always in the reset state. Specifically, the first end of the second switch S2 is at a low voltage, and after applying the low voltage to the inverter INV, a voltage at the third output end of the current generating module 110 is a high voltage, the sixth transistor M6 is turned off, the seventh transistor M7 is turned on, thus the fifth transistor M5 is turned on, and the current flowing through the fifth transistor M5 is Iref. Under actions of the seventh transistor M7 and the fifth transistor M5, a voltage of the fourth output end of the current generating module 110 is pulled to a low voltage, and a voltage of the fourth output end of the current generating module 110 is compared with the first comparator C1 and the second comparator C2, and a low voltage is output at the output end of the first comparator, and a high voltage is output at the output end of the second comparator, and finally after applying to the first control logic circuit and the second control logic circuit, a high voltage is output at the output end of the first control logic circuit, and a low voltage is output at the output end of the second control logic circuit.

After the power supply is turned on, before the enable control signal is released by the POR circuit 200, the voltages of all of the nodes of the oscillator circuit 100 remain unchanged, and as the power supply is turned on, a voltage of each of the nodes in the current generating module 110 are increased, and finally a stable current path is formed.

After the POR circuit 200 is powered on, the enable control signal is generated after a voltage of the power supply is stable, that is, the enable control signal is released by the POR circuit 200 automatically, and then under an action of the enable control signal, the switch control module will be changed into a working state automatically, then the oscillation loop is closed, thus the oscillation signal is generated stably, so as to start the clock circuit quickly. Meanwhile, under the action of the enable control signal, a switch state of the switch control module is changed, that is, the first switch S1 is turned on, the second switch S2 is turned off, under an action of the control signal output by the loop oscillation module 120, the capacitor C is charged or discharged by the current mirror branch circuit to form a periodic oscillating clock signal whose high and low levels are constantly changing, thus the clock circuit only needs to oscillate once in the oscillating circuit to set up completely, and the setting time is short.

Specific, after the enable control signal is released by the POR circuit 200, since the first end of the second switch S2 is affected by a voltage at a node A, a voltage at the first end of the second switch S2 is changed from a low voltage to a high voltage, after the high voltage is applied to the inverter INV, a voltage at the third output end of the current generating module 110 is a low voltage, meanwhile, the sixth transistor M6 is turned on, the seventh transistor M7 is turned off, thus the third transistor M3 and the sixth transistor M6 are turned on, then the capacitor is charged, and a voltage V1 on the capacitor is gradually increased from a low voltage.

When the voltage V1 is lower than a voltage VL of the first input end of the second comparator (that is, V1<VL), the capacitor C is kept charging, thus the voltage V1 becomes larger and larger until the voltage V1 is larger than a voltage of the first input end of the second comparator, a comparison result of the second comparator C2 is changed, meanwhile, a high voltage is output at the output end of the first control logic circuit NOR1, and a low voltage is output at the output end of the second control logic circuit NOR2, an output end voltage of the second comparator C2 is changed from a high voltage to a low voltage, and the capacitor C is kept charging, thus the voltage V1 is kept increasing, When the voltage V1 is larger than an input voltage VH of the second input end of the first comparator (V1>VH), a comparison result of the first comparator is changed, meanwhile, an output end voltage of the first comparator is changed from a low voltage to a high voltage, and the output end voltage of the second comparator is changed from a low voltage to a high voltage, a voltage of the first end of the second switch is changed from a low voltage to a high voltage, a voltage at the third output end of the current mirror branch circuit is changed from a low voltage to a high voltage, thus the sixth transistor M6 is turned off, and the seventh transistor M7 is turned on, then the capacitor is discharged, and a voltage of the fourth output end of the current mirror branch circuit is dropped. When VL<V1<VH, the comparison result of the first comparator is changed, meanwhile, the voltage of the output end of the first comparator is changed from a high voltage to a low voltage, and a high voltage is output at the output of the second control logic circuit, a low voltage is output at the output of the first control logic circuit, and the capacitor is kept discharging.

Before the voltage V1 is decreased to the voltage VL of the first input end of the second comparator, the node voltage state of the loop oscillation module remains unchanged. When the voltage V1 is lower than the voltage VL of the first input end of the second comparator, the comparison result of the second comparator is changed, a high voltage is output at the output end of the second comparator, meanwhile, a voltage at the output end of the second control logic circuit is changed from a high voltage to a low voltage, and a voltage at the output end of the first control logic circuit is changed from a low voltage to a high voltage, the voltage at the node A is changed from a low voltage to a high voltage, the voltage at the third output end of the current mirror branch circuit is changed from a high voltage to a low voltage, the sixth transistor M6 is turned on, the seventh transistor M7 is turned off, and the capacitor C is in a charging mode. It can be seen that a clock of the voltage V1 is limited between the input voltage VH of the second input end of the first comparator C1 and the voltage VL of the first input end of the second comparator C2, and the voltage at the third output end of the current mirror branch circuit is a square wave that is constantly changing between the high voltage and the first voltage, a time at the high voltage thereof is equal to a discharge time of the capacitor, and a time at the low level is equal to a charge time of the capacitor. After the enable control signal is released by the POR circuit 200, the capacitor can keep outputting a stable periodic square wave after only one charging cycle, and a circuit startup time is very short after the power supply is turned on.

Embodiment 2

Figure 3:
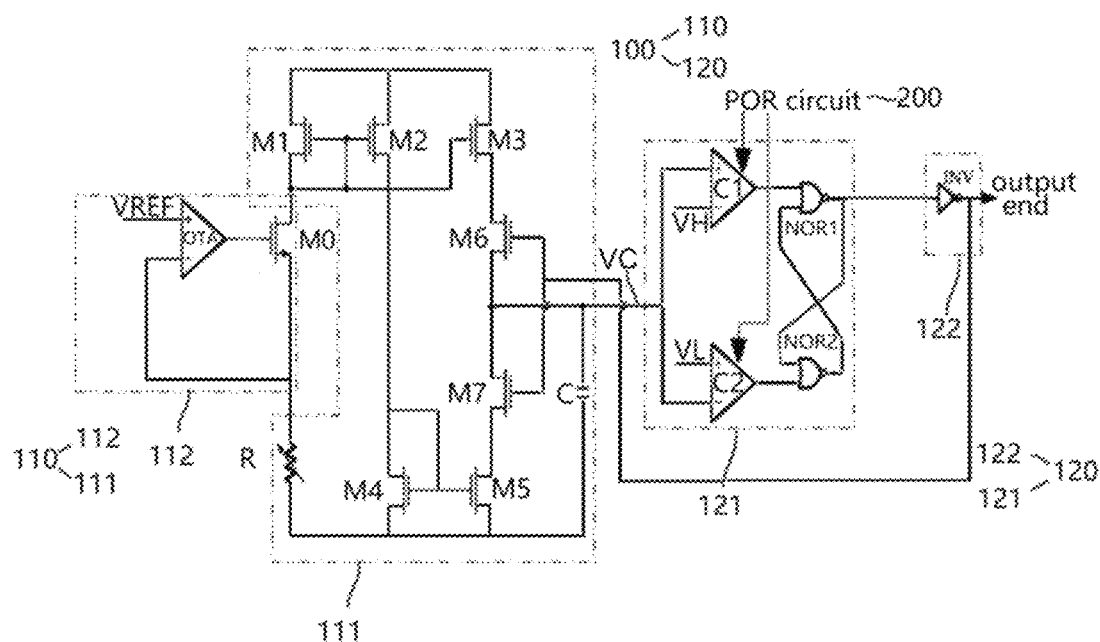
FIG. 3 is a schematic structural diagram of a clock circuit according to embodiment 2 of the present invention.
description of reference numbers.

This embodiment provides a clock circuit. A difference between this embodiment and the first embodiment is that: as shown in FIG. 3, the oscillator circuit 100 comprises the current generating module 110 and the loop oscillation module 120, and the POR circuit 200 is directly connected to the loop oscillation module 120, further, the loop oscillation module 120 comprises a first sub-module 121 and a second sub-module 122 connected in series, and the POR circuit 200 is connected to the first sub-module 121.

Specifically, there is a node B1 between the output end of the first comparator and the first input end of the first control logic circuit NOR1, and there is a node B2 between the output end of the second comparator C2 and the second input ends of the second control logic circuit NOR2, the first output end of the POR circuit 200 is connected at the node B1, and the second output end of the POR circuit 200 is connected at the node B2. The voltages of all of the nodes of the current generating module 110 can be set simultaneously as node voltages of the loop oscillation module 120 connected to the POR circuit 200 are set, thus a stable time of the oscillator circuit is only a time required for releasing the POR circuit, so as to accelerate the settling time of the oscillator circuit.

To sum up, in the oscillator circuit of the clock circuit provided by the present invention, the current generating module will not be locked, and only the loop oscillation module can be deadlocked. Then, the current generating module cannot be controlled by the enable control signal of the POR circuit, during the power-on process of the power supply, all of the nodes of the current generating module are gradually set with the power-on of the power supply, thereby the setting time of the current generating module is comprised in a release time of the enable control signal of the POR circuit, within the release time of the enable control signal, so as to accelerate the settling time of the oscillator circuit.

In addition, it should be noted that, unless otherwise specified or pointed out, the descriptions of the terms "first", "second", etc. in the specification are only used for distinguish various components, elements, steps, etc. in the specification, rather than to indicate the logical relationship or sequence relationship between various components, elements, steps, etc.

The above descriptions are only the preferred embodiments of the present invention, and the described embodiments are not used to limit the scope of patent protection of the present invention. Therefore, any equivalent structural changes made using the contents of the description and drawings of the present invention should be included of the same reasoning. Within the protection scope of the appended claims of the present invention.

What is claimed is:

1. A clock circuit comprises an oscillator circuit and a power-on reset circuit, wherein the oscillator circuit comprises a current generating module and a loop oscillation module connected together;
    the current generating module is used for outputting a control current to the loop oscillation module;
    the loop oscillation module is used for outputting an oscillation signal with a set frequency under action of the control current; and
    the power-on reset circuit is connected to the loop oscillation module and is used for providing an enabling control signal to the loop oscillation module after a power supply is powered on to the power-on reset circuit and the oscillator circuit.

2. The clock circuit of claim 1, wherein the loop oscillation module comprises a first sub-module and a second sub-module, the first sub-module and the second sub-module are connected in series, and the first sub-module comprises a plurality of comparators and control logic circuits.

3. The clock circuit of claim 2, wherein the first sub-module comprises a first comparator, a second comparator, a first control logic circuit and a second control logic circuit;
    a first input end of the first comparator is simultaneously connected to a current mirror circuit branch and a second input end of the second comparator; a second input end of the first comparator is floating; a first input end of the first control logic circuit is connected to an output end of the first comparator; a second input end of the first control logic circuit is connected to an output end of the second control logic circuit; an output end of the first control logic circuit is simultaneously connected to a switch control module and the first input end of the second control logic circuit; a first input end of the second comparator is floating, and an output end of the second comparator is connected to a second input end of the second control logic circuit.

4. The clock circuit of claim 3, wherein the power-on reset circuit comprises a first output end and a second output end;
    the first output end of the power-on reset circuit is simultaneously connected to the first input end of the first control logic circuit and the output end of the first comparator; and the second output end of the power-on reset circuit is simultaneously connected to the output end of the second comparator and the second input end of the second control logic circuit.

5. The clock circuit of claim 3, wherein the oscillator circuit further comprises the switch control module, and the power-on reset circuit is connected to the loop oscillation module by the switch control module.

6. The clock circuit of claim 5, wherein the switch control module is connected between the first sub-module and the second sub-module.

7. The clock circuit of claim 6, wherein the switch control module comprises a first switch and a second switch;

a first end of the first switch is simultaneously connected to the output end of the first control logic circuit and the power-on reset circuit; a second end of the first switch is simultaneously connected to a first end of the second switch and the input end of the second sub-module; a second end of the second switch is grounded and connected to the power-on reset circuit simultaneously; wherein, the first switch and the second switch are selectively turned on.

8. The clock circuit of claim 2, wherein a first end of the second sub-module is connected to the switch control module, and a second end of the second sub-module is connected to the current mirror branch circuit and used as an output end of the oscillator circuit.

9. The clock circuit of claim 8, wherein the second sub-module comprises a plurality of inverters.

10. The clock circuit of claim 1, wherein the current generating module comprises a current mirror circuit branch, a feedback loop and a capacitor, the feedback loop is used for generating a substantially constant current required in the oscillator circuit, and the current mirror branch circuit is used for generating a current required for charging and discharging of the oscillator circuit and generating a periodic oscillation signal by charging and discharging of the capacitor.

* * * * *